United States Patent [19]

Balasubramanian et al.

[11] 4,140,967
[45] Feb. 20, 1979

[54] MERGED ARRAY PLA DEVICE, CIRCUIT, FABRICATION METHOD AND TESTING TECHNIQUE

[75] Inventors: Peruvemba S. Balasubramanian, Manassas; Claude R. Bertin, Oakton; Stephen B. Greenspan, Reston, all of Va.

[73] Assignee: International Business Machines Corporation, Armonk, N.Y.

[21] Appl. No.: 809,877

[22] Filed: Jun. 24, 1977

[51] Int. Cl.² ............... G01R 15/12; G01R 31/26; 235 302
[52] U.S. Cl. ............... 324/73 R; 324/158 R
[58] Field of Search ............... 324/73 R, 158 R

[56] References Cited
U.S. PATENT DOCUMENTS

| | | | |
|---|---|---|---|
| 3,789,205 | 1/1974 | James | 235/302 |
| 3,790,885 | 2/1974 | James | 324/73 R |

Primary Examiner—Rudolph V. Rolinec
Assistant Examiner—Ernest F. Karlsen

Attorney, Agent, or Firm—John E. Hoel

[57] ABSTRACT

A merged AND/OR array PLA is disclosed wherein the merger is accomplished by forming the gates of the FET devices in the AND array by means of an upper conductor layer and the gates of the FET devices in the OR array, which are connected to the drain of the devices in the AND array, by means of lower level conductor layer, so that the devices are contiguous. The PLA structure uses a polysilicon layer for interconnection between AND array FET drains and OR array FET gates, with the AND array FETs or OR array FETs being intermixed in a single array. The OR array outputs are oriented vertically, alternating between the AND product terms and ground diffusions. All PLA outputs are oriented vertically within the same array. A testing technique and special testing circuitry is disclosed which makes use of the existing bit partitioning input buffer as the source of test patterns and the existing output latches as the storage for the test response bits for individually testing both the AND components and the OR components in the merged array PLA.

3 Claims, 33 Drawing Figures

SECTION A-A'

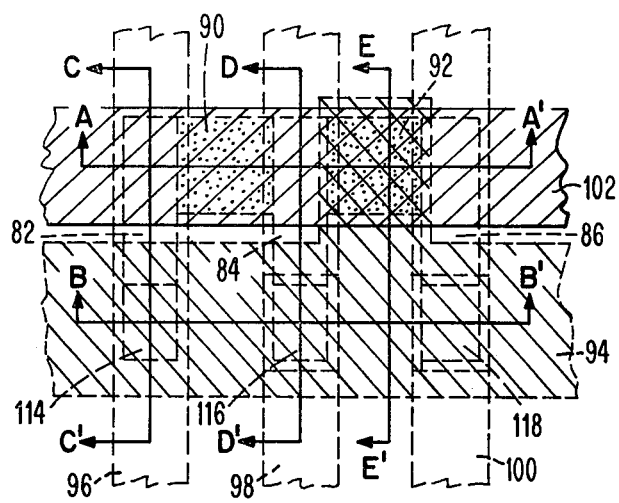
FIG. 9a
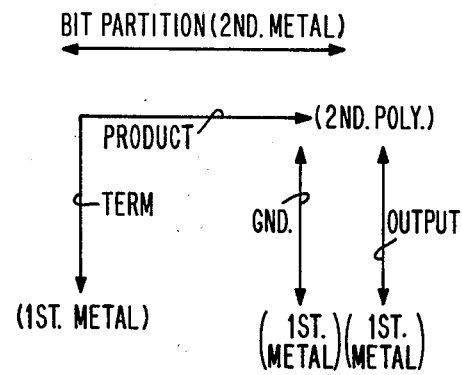
FIG. 9g
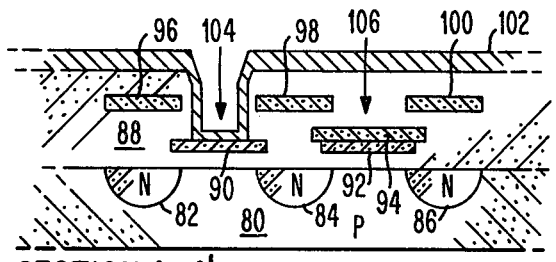
SECTION A-A'  FIG. 9b
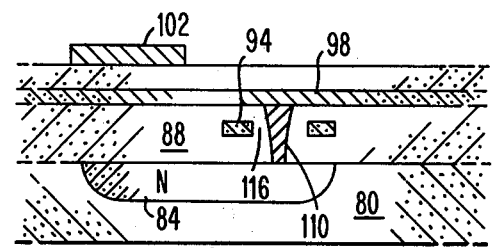
SECTION D-D'  FIG. 9e
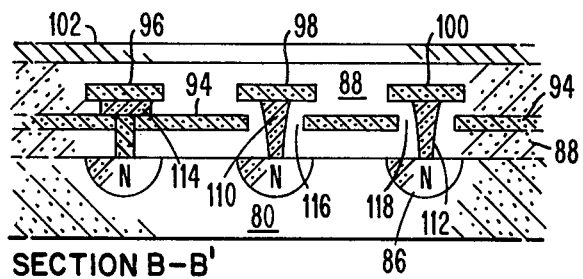
SECTION B-B'  FIG. 9c
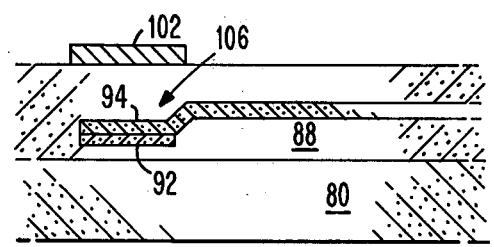
SECTION E-E'  FIG. 9f
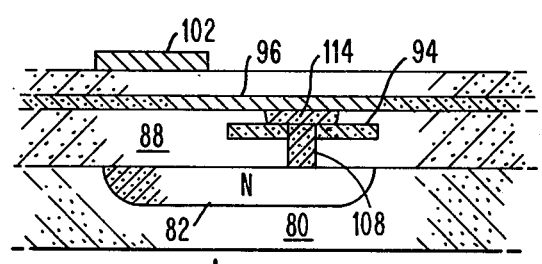
SECTION C-C'  FIG. 9d

MERGED ARRAY PLA DEVICE, CIRCUIT, FABRICATION METHOD AND TESTING TECHNIQUE

FIELD OF THE INVENTION

The invention disclosed generally relates to semiconductor device circuits and more particularly relates to programmed logic array circuits.

BACKGROUND OF THE INVENTION

Performing logic functions in an array of identical circuit elements each located at a unique intersection of an input and output line in a grid of intersecting input and output lines is well known. It is also well known to perform complex logic functions in a compound arrangement of these arrays called a programmable logic array chip (PLA) by using the outputs of one array as the inputs to another array. U.S. Pat. No. 3,936,812 describes such a PLA on which a number of decoders feed inputs to a first array called a product term generator or an AND array which in turn supplies outputs to a second array called a sum of product term generator or an OR array. The outputs of the OR array are then used to control the setting and resetting of a string of latches so that both combinatorial and sequential logic functions can be performed by the PLA. The particular logic functions actually performed by the given PLA are controlled by the locations and number of the active logic circuits in the AND and OR arrays of the PLA and also by how inputs are supplied to the decoders either from off the chip or from the latches.

FIG. 1 illustrates a conventional implementation of a PLA in MOSFET technology where the distinct AND 2 and OR 4 arrays are shown. Inputs 6 to the AND array 2 from the input bit partitioning circuit 8 are on the metal level devices 10 in the AND array 2 which is made active by growing a thin oxide region between ground diffusions 11 and product term diffusions 12. Signal outputs from the AND array 2 are transmitted through diffused product array lines 12. As these product terms enter the OR array 4, they are transformed to the metal level 16 through contacts 14 as shown. The OR array 4 devices 18 are active if a thin oxide region is grown between ground diffusions 19 and output diffusions 20. Outputs from the OR array are on diffused lines 20. Prior art PLA circuits such as this required a relatively large chip area to layout and suffer from an inability to independently test the AND and OR array elements without additional input buffers and output latches. FIG. 1, for clarity is not optimum in terms of density. An additional vertical product term line can be placed between ground diffusions for additional density.

OBJECTS OF THE INVENTION

It is therefore an object of the invention to provide an improved PLA circuit which occupies a reduced chip area.

It is another object of the invention to provide an improved PLA circuit which can be more completely tested.

It is still a further object of the invention to fabricate a PLA array in an improved manner.

It is yet another object of the invention to provide an improved PLA device structure.

SUMMARY OF THE INVENTION

These and other objects, features and advantages of the invention are accomplished by the merged array PLA invention.

The merger in the merged AND/OR array PLA is accomplished by forming the gates of the FET devices in the AND array by means of an upper conductor layer and the gates of the FET devices in the OR array, which are connected to the drain of the devices in the AND array, by means of lower level conductor layer, so that the devices are contiguous. The PLA structure uses a polysilicon layer for interconnection between AND array FET drains and OR array FET gates, with the AND array FETs and OR array FETs being intermixed in a single array. The OR array outputs are oriented vertically, alternating between the AND product terms and ground diffusions. All PLA outputs are oriented vertically within the same array. Orienting the polycrystalline silicon line parallel to the input line and orienting the axes of the centroids for the AND FETs and the OR FETs parallel to the input line allows a retention of the high density for the array by permitting the placement of output latches on the top and bottom edges of the array and the placement of the input driver/decoder circuits on the lateral edges of the array so that the close pitch of the array can be maintained. Several alternate device structures and their methods of fabrication are disclosed for implementing the merged array PLA. A testing technique and special testing circuitry is disclosed which makes use of the existing bit partitioning input buffer as the source of test patterns and the existing output latches as the storage for the test response bits for individually testing both the AND components and the OR components in the merged array PLA.

Several alternate device structures and their methods of fabrication are disclosed for implementing the merged array PLA. A testing technique and special testing circuitry is disclosed which makes use of the existing bit partitioning input buffer as the source of test patterns and the existing output latches as the storage for the test response bits for individually testing both the AND components and the OR components in the merged array PLA.

DESCRIPTION OF THE FIGURES

These and other objects, features and advantages of the invention will be more particularly appreciated with reference to the accompanying drawings.

FIG 3b is a cross-sectional view along A-A' of the structure in FIG. 3a.

FIG. 3c is a cross-sectional view along A'-B of the structure of FIG. 3a.

FIG. 3d is a cross-sectional view along C-C' of the structure of FIG. 3a.

FIG. 3e schematically illustrates the relative direction of the various conductor lines in FIG. 3a.

FIG. 7b is a cross-sectional view along A-A' of FIG. 7a.

FIG. 7c is a cross-sectional view along B-B' of FIG. 7a.

FIG. 7d schematically illustrates the relative direction of the conductor lines in FIG. 7a.

FIG. 8b is a cross-sectional view along A-A' of the structure of FIG. 8a.

FIG. 8c schematically illustrates the relative directions of the conductor lines in FIG. 8a.

FIG. 9a is still a further alternate embodiment for the device structure for the AND and OR elements of the PLA.

FIG. 9b is a cross-sectional view along A-A' of the structure of FIG. 9a.

FIG. 9c is a cross-sectional view along B-B' of the structure of FIG. 9a.

FIG. 9d is a cross-sectional view along C-C' of the structure of FIG. 9a.

FIG. 9e is a cross-sectional view along D-D' of the structure of FIG. 9a.

FIG. 9f is a cross-sectional view along E-E' of the structure of FIG. 9a.

FIG. 9g schematically illustrates the relative direction of the conductor lines for the structure of FIG. 9a.

DISCUSSION OF THE PREFERRED EMBODIMENT

Figure 1:
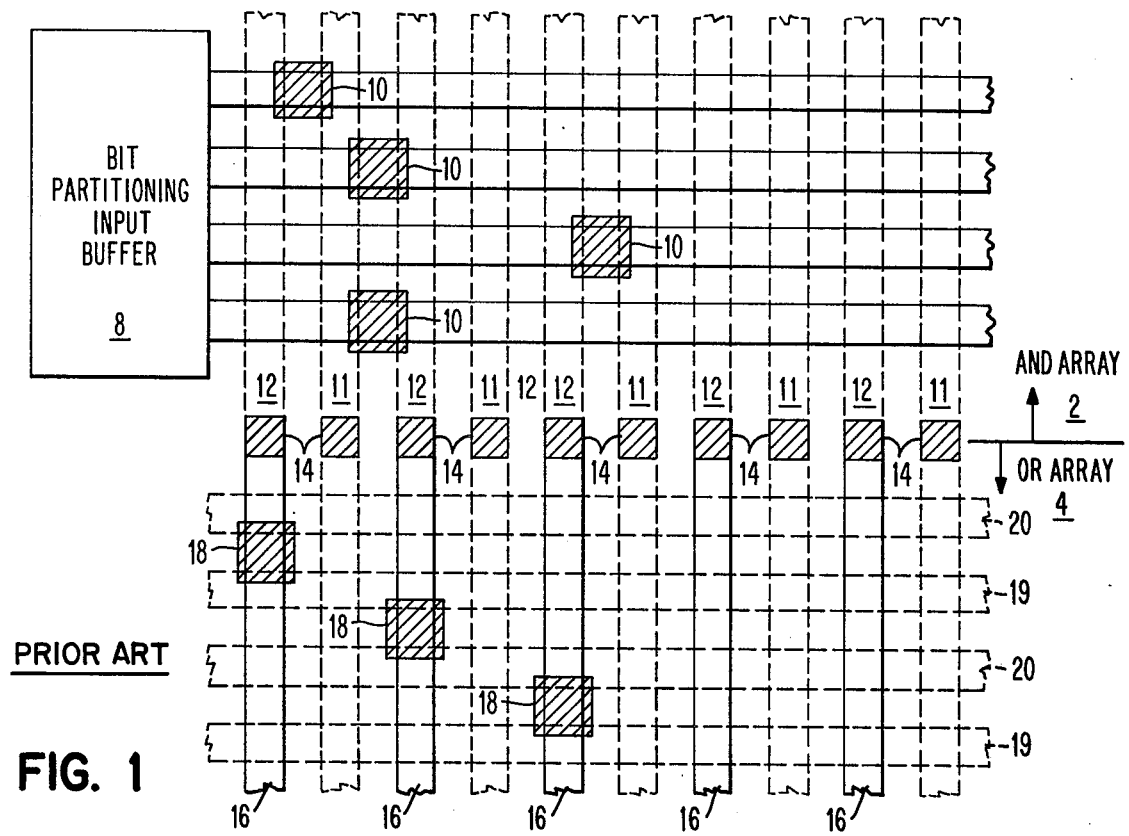
FIG. 1 is a view of the layout of a prior art field effect transistor programmed logic array.
Figure 2:
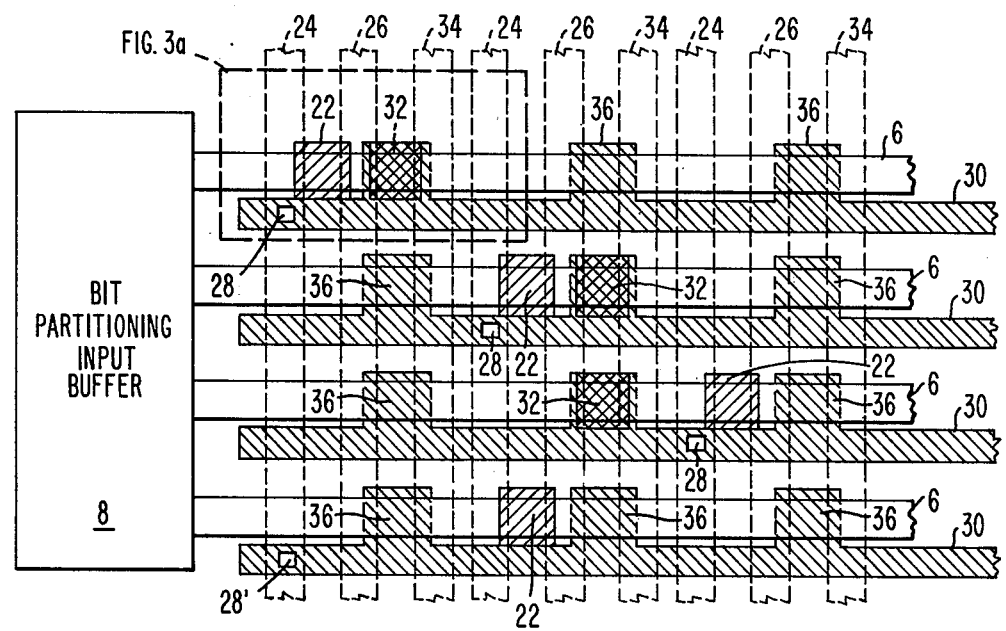
FIG. 2 is a view of the layout of the merged array programmed logic array structure, in accordance with the invention.

FIG. 2 illustrates the merged array PLA structure in accordance with the invention wherein the merger is accomplished by forming the gates of the FET devices in the AND array by means of an upper conductor layer in the gates of the FET devices in the OR array, which are connected to the drain of the devices in the AND array, by means of lower level conductor layers, so that the devices are contiguous.

FIG. 2 shows a bit partitioning input buffer 8 which provides input signals on the metal input lines 6 for the array. An FET device 22 is formed whereever the oxide insulation separating the metallized line 6 from the semiconductor substrate is thinner between the vertical diffusions 24 and 26. Diffusion 26 is connected to ground potential and therefore when a signal is present on the metal input line 6, conduction is obtained through the FET device 22 between the diffusion 26 and the PT1 product term diffusion 24. A via interconnection 28 connects the product term diffusion 24 to a horizontal conductor 30 composed of polycrystalline silicon which lies beneath the upper level supporting the metal input line 6. The horizontal line 30 has a gate portion overlying the FET device 32 formed in a thinned region of the oxide insulator layer between the ground diffusion 26 and output diffusion 34. Since the potential of the polysilicon line 30 has dropped to ground, conduction is curtailed between the ground diffusion 26 and the output diffusion 34 thereby causing an up output level signal on output diffusion 34.

The merged PLA structure of FIG. 2 is shown in greater detail in FIGS. 3a–3d where it can be seen that the structure uses a polysilicon layer 30 for interconnection between AND array FET drain 24 which is the product term and the OR array FET gate 32, with the AND array FETs 22 and the OR array FETs 32 being intermixed in a single array. The OR array outputs 34 are oriented vertically, alternating between the AND product term 24 and the ground diffusion 26. All of the PLA outputs are oriented vertically and all of the inputs are oriented horizontally within the same array, as is indicated in FIG. 3e. Polysilicon layer 30 is used as a product term interconnect between the AND product terms 24 and the OR device gates 32. In the equivalent OR array function, the polysilicon level also acts as the gate electrode 32 for the OR array of FET devices. Density improvements for this configuration result from the elimination of the OR array area since the OR array outputs are oriented vertically, alternating between the AND product terms 24 and ground diffusions 26. Connection between the AND array product term lines 24 and the OR array gates 32 is provided by the polycrystalline silicon layer 30 as is shown. Density improvements also result from the chip layout which is compressed since all the PLA outputs are oriented vertically top to bottom and all of the PLA inputs are oriented horizontally left to right within the same array, as shown in FIG. 5.

Figure 5:
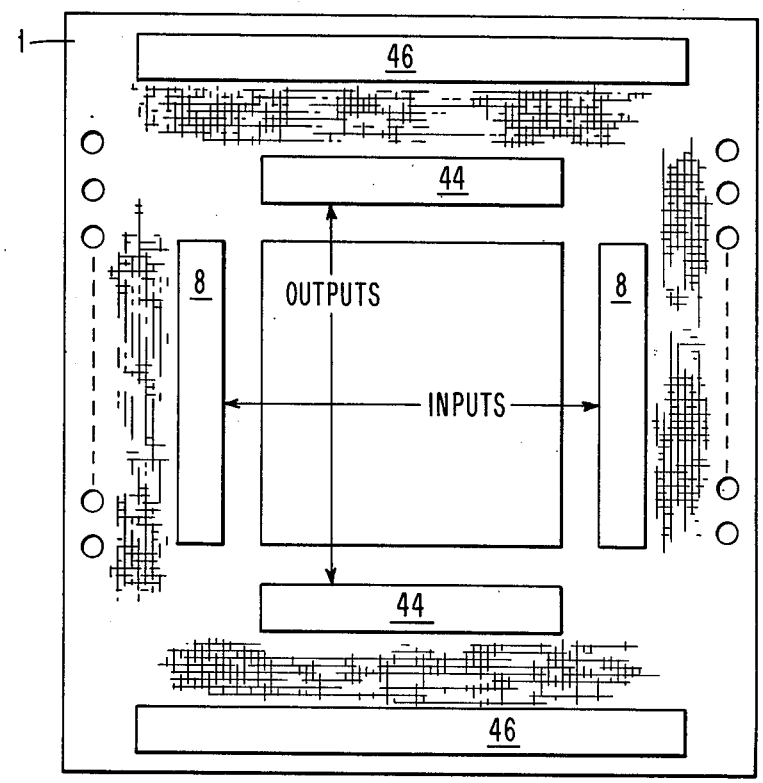
FIG. 5 illustrates the chip layout for the merged array PLA.

The output latches 44 and the input partitioning circuits 8 are placed along the top and bottom sides of the merged array PLA, respectively, as shown in FIG. 5. In a similar manner, the off chip drivers 46 can be placed along the top and bottom of the chip while the input ports can be oriented on the sides of the chip. Wiring from the I/O ports to the array peripheral circuits is accomplished via x-y bus matrix consisting of diffusion/metal or polysilicon/metal wiring.

Figure 6:
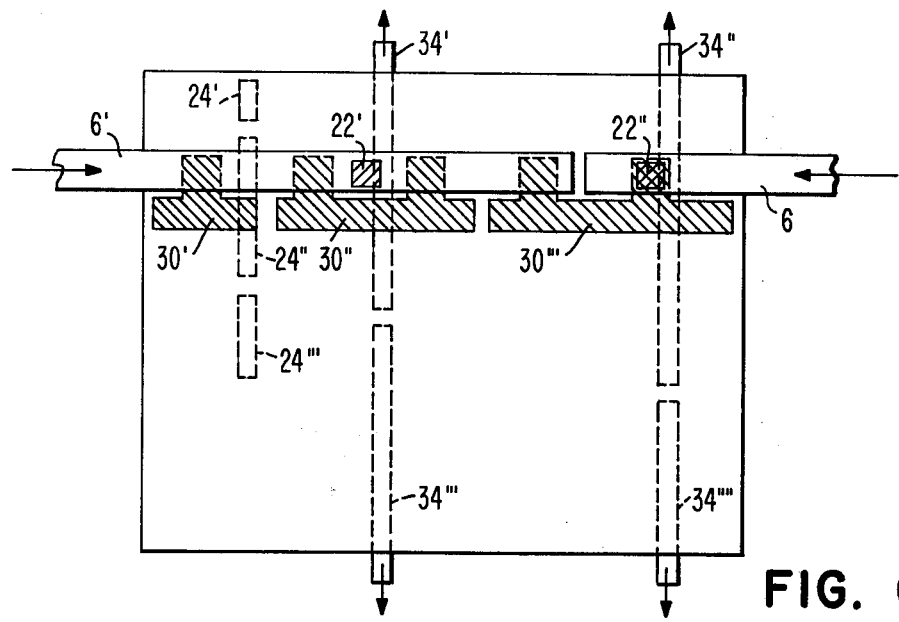
FIG. 6 illustrates the multiple folding capability for the merged array PLA.

Improvements also result from the architecture which provides for the straightforward implementation of virtual array folding PLA techniques as is shown in FIG. 6. This improves the effective number of AND inputs 6' and 6", since each horizontal metal input line 6' and 6" can be cut along its horizontal axis. The cut location depends on the product term utilization/distribution in a manner similar to that disclosed in U.S. Pat. No. 3,936,812, assigned to the instant assignee. Each horizontal input line axis 6', 6" can therefore be driven from both the left and right side of the array. In addition, the architecture provides for the virtual number of product terms to be more than doubled by cutting the horizontal OR array polysilicon product term lines 30', 30", 30''', etc. along the horizontal axis and the vertical AND array product term line along the vertical axis 24', 24", 24''', etc. A still further contribution of the architecture to density improvement is the number of output lines can be doubled by cutting the diffused output lines 34', 34" which run vertically in the array. Although masking changes on the diffusion level are typically not employed in arrays in MOSFET products for economic reasons, this option is nevertheless available.

Figure 3A:
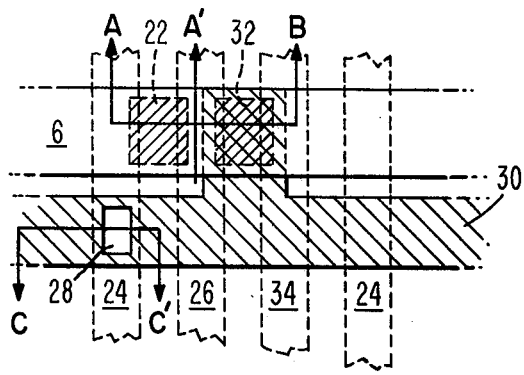
FIG. 3a is a detailed view of a portion of FIG. 2, of the merged array PLA.
Figure 3E:
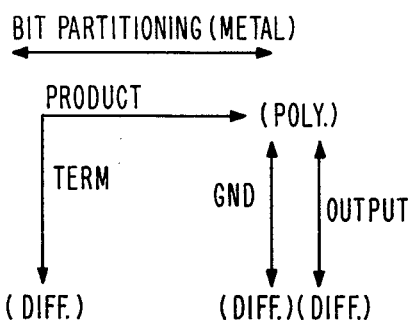
Figure 3B:
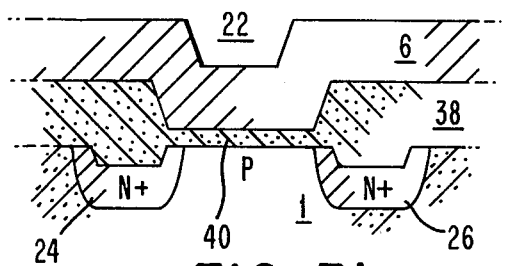
Figure 3C:
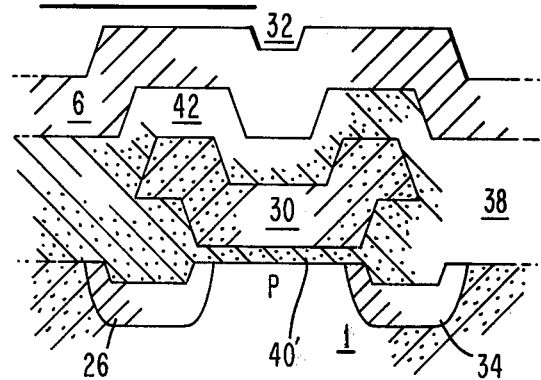
Figure 3D:
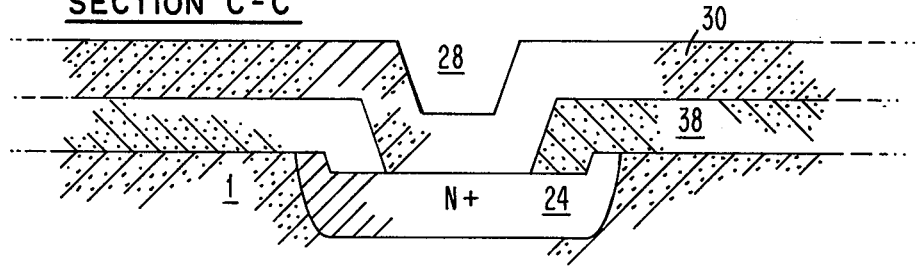
Figure 4:
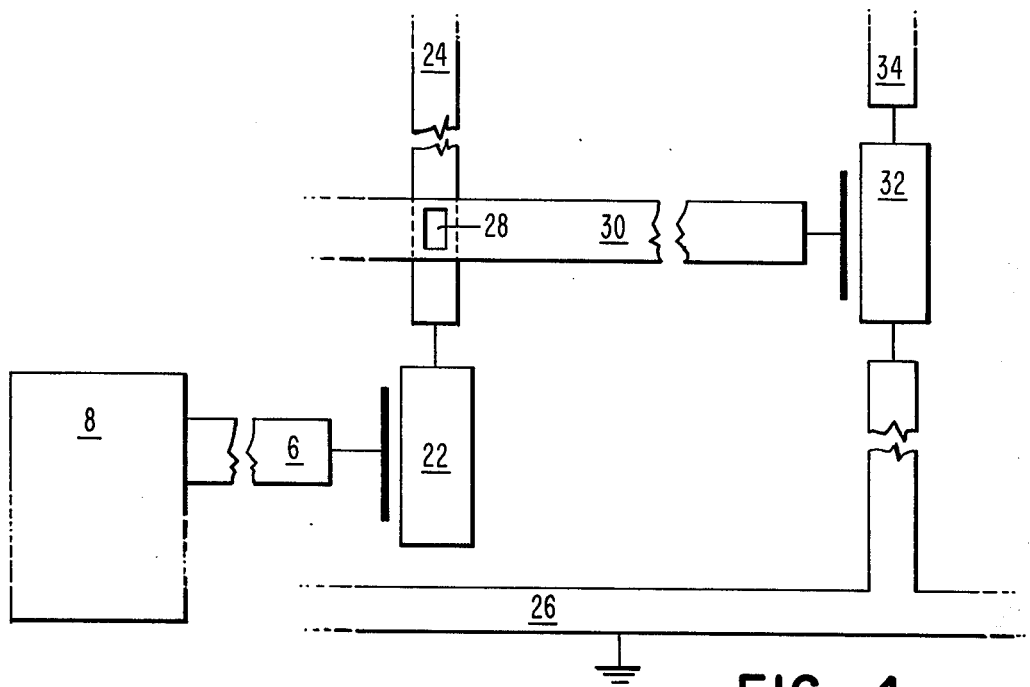
FIG. 4 illustrates the relative position of the AND and the OR array elements in the merged array PLA.

FIGS. 3b, 3c and 3d are cross-sectional views of various portions of the merged array PLA shown in detail in FIG. 3a. In FIG. 3b, the structure of the metal gate FET 22 is shown, where the thick oxide layer 38 overlies the field region and the thin oxide layer 40 overlies the channel region between the product termed n+ diffusion 24 and the ground n+ diffusion 26 in the p-type substrate 1. The bit partitioning metal lines 6 follows the contour of a thin oxide layer 40, thereby forming the gate for the FET device 22 which is the AND array element. FIG. 3c shows a cross-sectional view along the line A'-B of the device 32 which is the OR array element. This polycrystalline silicon gate FET device has a thin oxide region 40' in the thick oxide 38, between the n+ ground diffusion 26 and the n+ output diffusion 34 in the substrate 1. The polycrystalline silicon product term line 30 has a vertical projection which follows the contour of the thin oxide region 40' thereby forming the gate of the FET device 32. Over the layer of polycrystalline silicon 30 is deposited an insulating layer of, for example, silicon dioxide 42 which insulates the polycrystalline silicon lines 30 from overlying bit partitioning metal lines 6. FIG. 3d is cross-sectional view along the section C-C' of the via contact connecting the polycrystalline silicon layer product term line 30 through the thick oxide layer 38 to the product term diffusion 24.

Figure 7D:
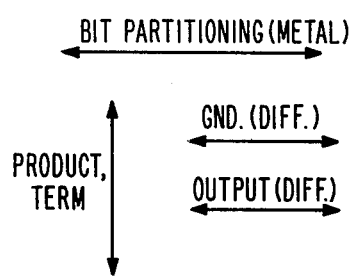
Figure 7A:
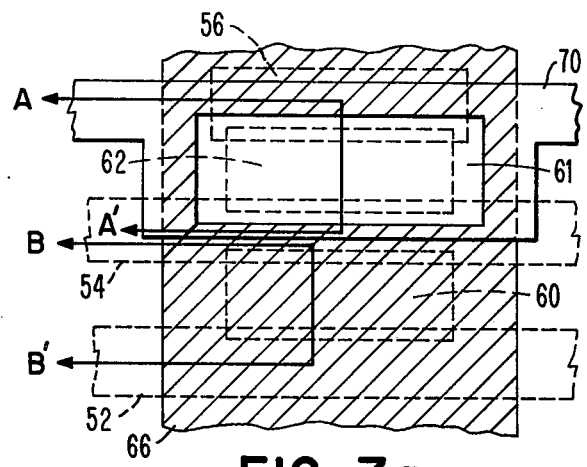
FIG. 7a illustrates an alternate embodiment of the AND and OR device structures for the merged array PLA.
Figure 7B:
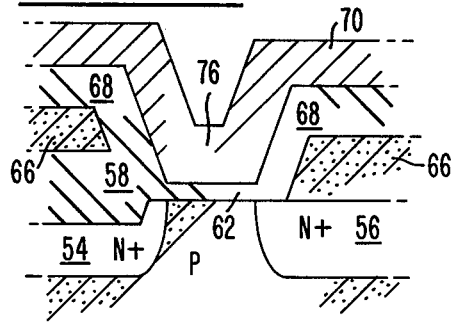
Figure 7C:
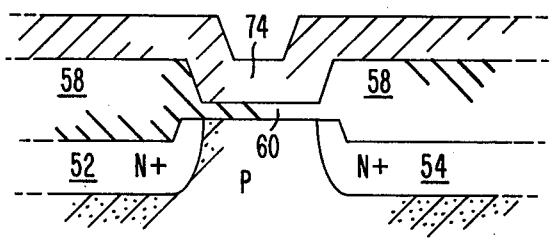
Figure 7E:
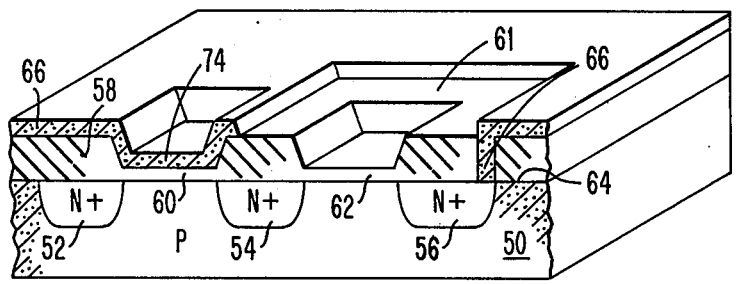
FIG. 7e shows an isometric view of the AND and OR array device after polysilicon but before metallization.
Figure 7F:
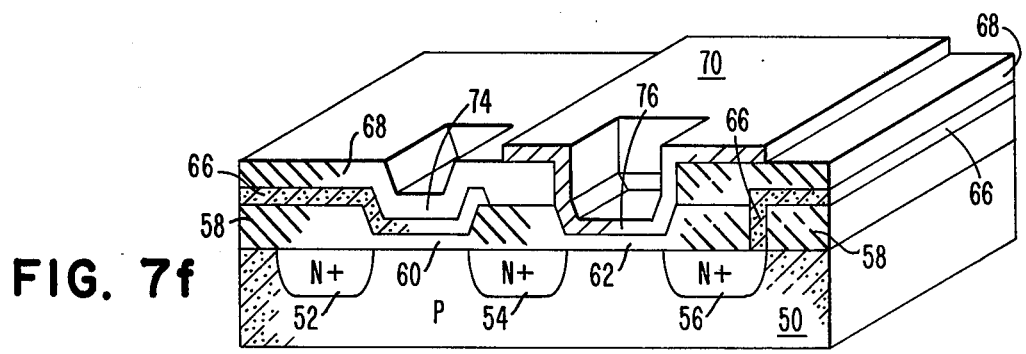
FIG. 7f shows the same view as FIG. 7e with the bit partitioning metallurgy forming the AND array gate which is surrounded by the polysilicon product term line.

Several alternate embodiments for the merged array PLA device structure are disclosed. A first alternate embodiment is shown in FIG. 7a-7d, which illustrates the merged PLA device with a polycrystalline silicon layer added to the base metal gate process, having the layout with partitioning input metal lines parallel to the output diffusions. FIG. 7a shows a top view of the AND array device 62 and the OR array device 60 with the bit partitioning metal lines 70 supplying the input signal which gates the AND array device formed between the ground diffusion 54 and a drain diffusion 56. Drain diffusion 56 is connected by means of a via hole contact to a vertical polycrystalline polysilicon product term line 66 which, in turn, also serves as the gate of the OR array device 60. FIG. 7b shows an n-type implant, for example, phosphorous, forms the drain 56. Contact is etched through the thin oxide 62 to the drain 56. Polysilicon is then deposited in doped n-typed forming the polysilicon product term line 66. This forms the contact to the drain 56 of the AND device 62 and also forms the gate 74 of the OR device 60. A window 61 is cut in the polycrystalline silicon product term line 66 as is shown in FIGS. 7a and 7e to allow the bit partitioning metal line 70 to pass therethrough without making electrical contact therewith so as to form the gate of the AND array device 62. The thin oxide is then etched away and the gate oxide is regrown to 500 Angstroms while greater than a 1000 Angstroms grows over the polycrystalline silicon line 66 forming the required insulating layer 68 shown in FIG. 7b. The last step is the deposition of the aluminum bit partitioning metal line 70. The array is personalized by omitting oxide cuts in a thick oxide layer 58 when no device is desired. Because the outputs and inputs line up, and because the metal and diffusion pitches are greater than individual arrays, the input and output circuitry should fit within the pitch of peripheral driver and latching circuit. FIG. 7e shows an isometric view of the shape of the polycrystalline silicon product term line 66 after it has been deposited and etched. FIG. 7f shows an isometric view of the formation of the oxide insulator layer 68 and the deposition of the bit partitioning metal line 70 for the device.

Figure 8A:
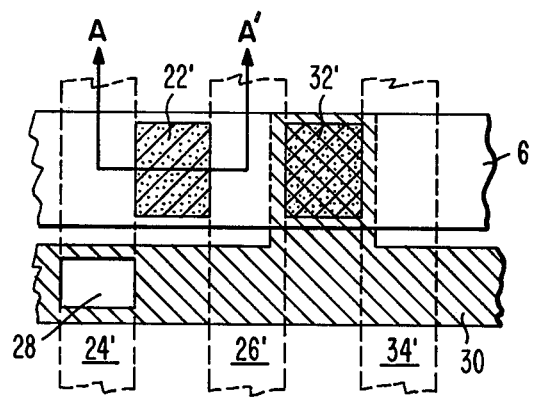
FIG. 8a is still another embodiment of the device structure for the AND and OR elements in the merged array PLA.
Figure 8C:
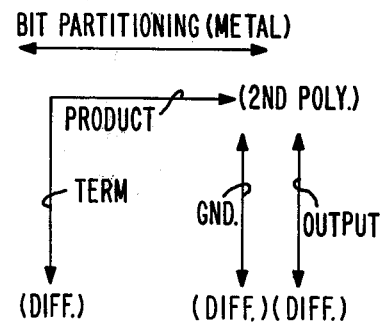
Figure 8B:
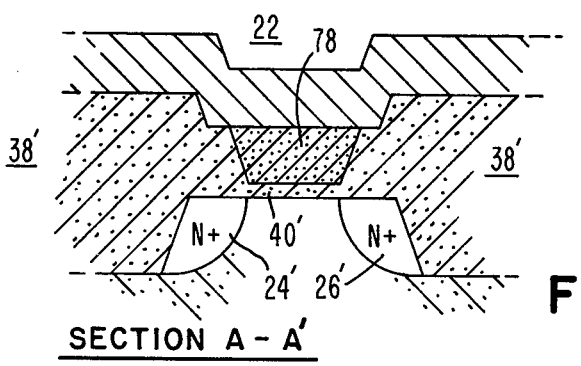

Still another alternate embodiment for the merged array PLA structure is shown in FIGS. 8a-8c wherein a double polycrystalline polysilicon self-aligned gate FET device is employed. The self-aligned gate structure is defined by the first polysilicon layer deposited in a thin oxide well, followed by diffusions which cannot cross the polycrystalline silicon lines. The first level of polycrystalline silicon 78 is employed to form the basic FET gate over the thin oxide region 40' between the n+ product term diffusion 24' and the n+ ground diffusion 26' for the AND array FET and between the n+ ground diffusion line 26' and the output n+ diffusion line 34' for the OR array FET, both of which are represented in cross-section in FIG. 8b. Contact 28 is used to connect product term diffusion 24' to a second level of polycrystalline silicon product term 30. An extension made of the second level polycrystalline silicon product term line 30 contacts the first level polycrystalline silicon gate 78 to complete the gate electrode for the OR device 32'. The metal bit partitioning line 6 contacts the first level polycrystalline silicon layer 78 between the product term 24' and the ground diffusion 26' thereby completing the gate electrode for the AND device 22'. FIG. 8c illustrates that the bit partitioning metal lies along the horizontal axis parallel with the second level polycrystalline silicon line 30 while the product term diffusion ground diffusion and output diffusions 24', 26' and 34', respectively are oriented vertically in the array.

Still another alternate embodiment for the structure for the devices in the merged array PLA is shown in FIGS. 9a-9g. The structure features a double level polycrystalline silicon layers and double level metal layers. The structure is a self-aligned gate structure which is performance as well as density oriented. The first level polycrystalline silicon layer 90 and 92 forms the gate electrode where the AND array FET device and the OR array FET device, respectively. The fabrication technique is a conventional self-aligned gate polycrystalline silicon deposition wherein the n-type diffusions 82, 84 and 86 in the p-type substrate 80 are self-aligned with respect to the polycrystalline silicon gate layers 90 and 92, respectively. The diffusions may be ion-implanted discrete regions large enough to accommodate the contact 108, 110 and 112, shown in FIG. 9c. A second polycrystalline silicon layer 94 forms the connection with the gate electrode 92 for the OR device 106 and has windows 116 and 118 formed therein through which may pass the vertical connections 110 and 118, shown in FIG. 9c. There follows a first level metal layer which forms the product term line 96, the ground line 98 and the output line 100 shown in a top view in FIG. 9a and in a cross-sectional view in FIG. 9c. The product term line 96 is connected by means of the vertical via connection 114 to the second level polycrystalline silicon line 94 and simultaneously to the diffusion 82 via connection 108. The ground metal line 98 is connected by means of the vertical connection 110 to the ground diffusion 84 and the output metal line 100 is connected by means of the vertical connection 112 to the output diffusion 86. The first level metal is used for the output ground and product terms instead of a diffusion in order to reduce the capacitive coupling and therefore delays encountered in using diffusions. The second level metal layer 102 forming the bit partitioning line is deposited on top of the oxide 88. The opening made through insulator 88 above gate 90 prior to metallization is dry etched using plasma etch techniques down to a barrier layer of silicon nitride. A via hole is made in the silicon nitride layer to the thin oxide layer below. The oxide is etched revealing the polysilicon gate 90. The second layer of metal is then deposited over the opening forming the connection between layers 90 and 102 shown in FIG. 9b. The cross-sectional view shown in FIG. 9f illustrates how the second level polycrystalline silicon line 94 will form both the gate connections for the OR device 106 and the drain connection by means of the vertical contact 108 with the product term diffusion 82 shown in FIG. 9d.

Figure 10:
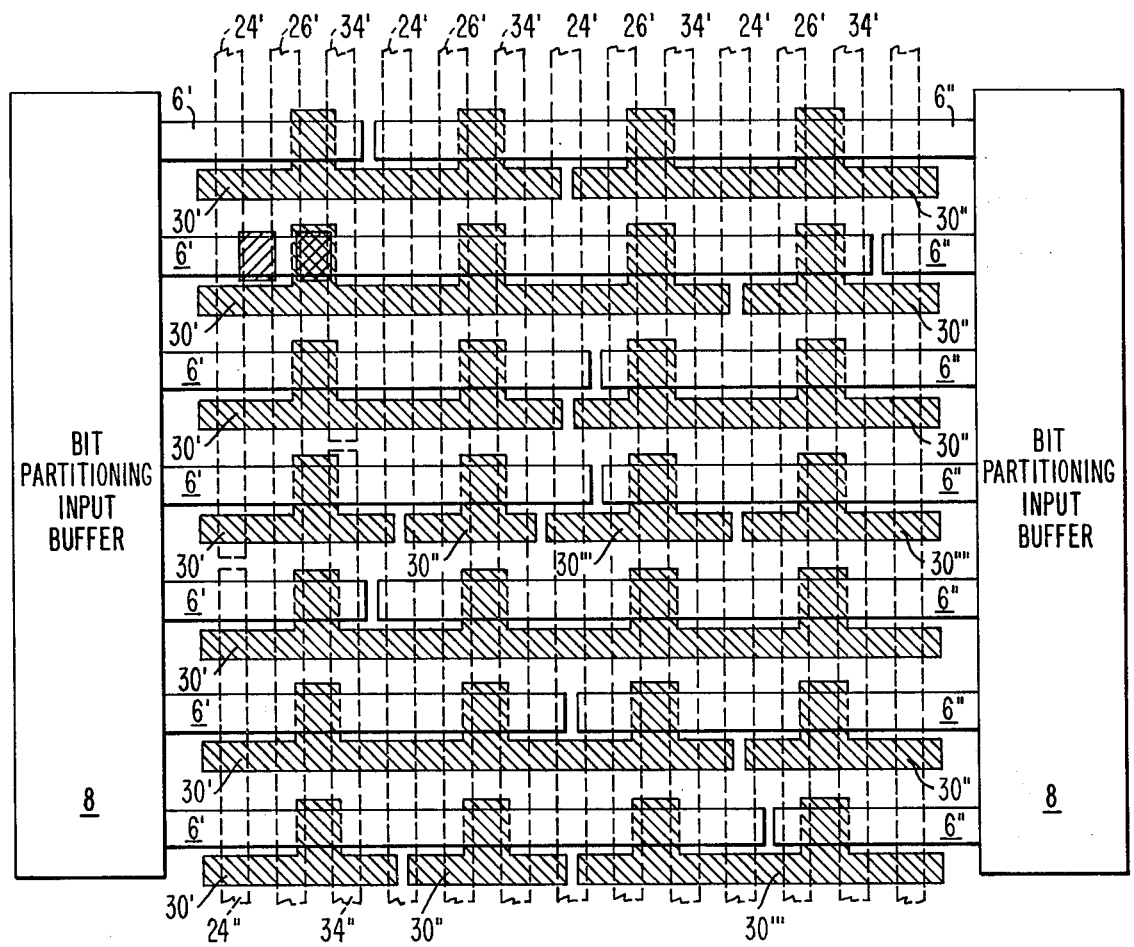
FIG. 10 is a view of the layout for the merged array PLA showing the dual folding capability.

FIG. 10 illustrates a substantial advantage which acrues from the use of merged array PLA structure by means of incorporating an additional folding layer over that available in the prior art which can be cut numerous times if it does not connect to peripheral devices. The additional folding layer is compared to that disclosed in the array for U.S. Pat. No. 3,936,812, assigned to the instant assignee, where the output lines 34' are cut so that the OR array is folded in both axes. As is shown in FIG. 10, the metal bit partitioning input line 6 may be cut into two lines 6' which is input from the left hand side of the array and 6" which is input from the right hand side of the array. In addition, the polycrystalline silicon horizontal product term lines 30 may be cut to form portions 30', 30", 30"', etc. Still further, the vertical product term line 24 may be cut into an product term lines 24', 24", etc. if it does not connect to peripheral devices. Still further, the output line 34 may be cut into an upper output line 34' communicating with upper latches and a lower output line 34" which will communicate with lower output latches.

Figure 11A:
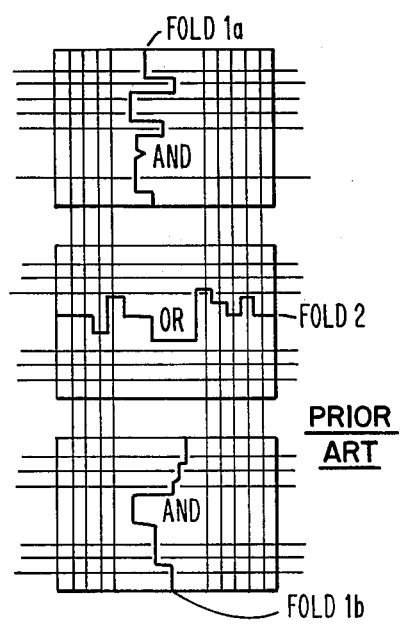
FIG. 11a shows the folding for the prior art PLA array.
Figure 11B:
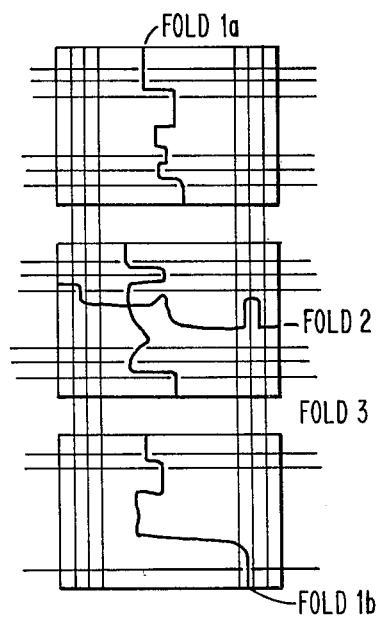
FIG. 11b shows the improved folding capability for the merged array PLA.

Product terms running vertically in the same sense as the output will allow for access to the AND array outputs. This greatly simplifies the testing of the PLA since the AND array can be uniquely tested by a simple algorithm. The merged array PLA provides for an increased physical density by merging these arrays. The merged arrays PLA increases its functional density over that of the prior art by folding the OR array outputs. So, further, the merged array PLA increases chip density and allows for a smaller chip through the symmetry resulting from the merged AND and OR arrays. This results in the compatibly designed input buffer and output latches to the array I/O pitch. Thus, connecting wiring or bussing may be greatly simplified. The folding advantages may be better seen in comparing FIG. 11a which illustrates the prior art folding technique disclosed in U.S. Pat. No. 3,936,812, assigned to the instant assignee, and that for the unmerged array with the additional fold shown in FIG. 11b for comparison purposes only. This analysis is based on one cut per polysilicon product term line.

Figure 12:
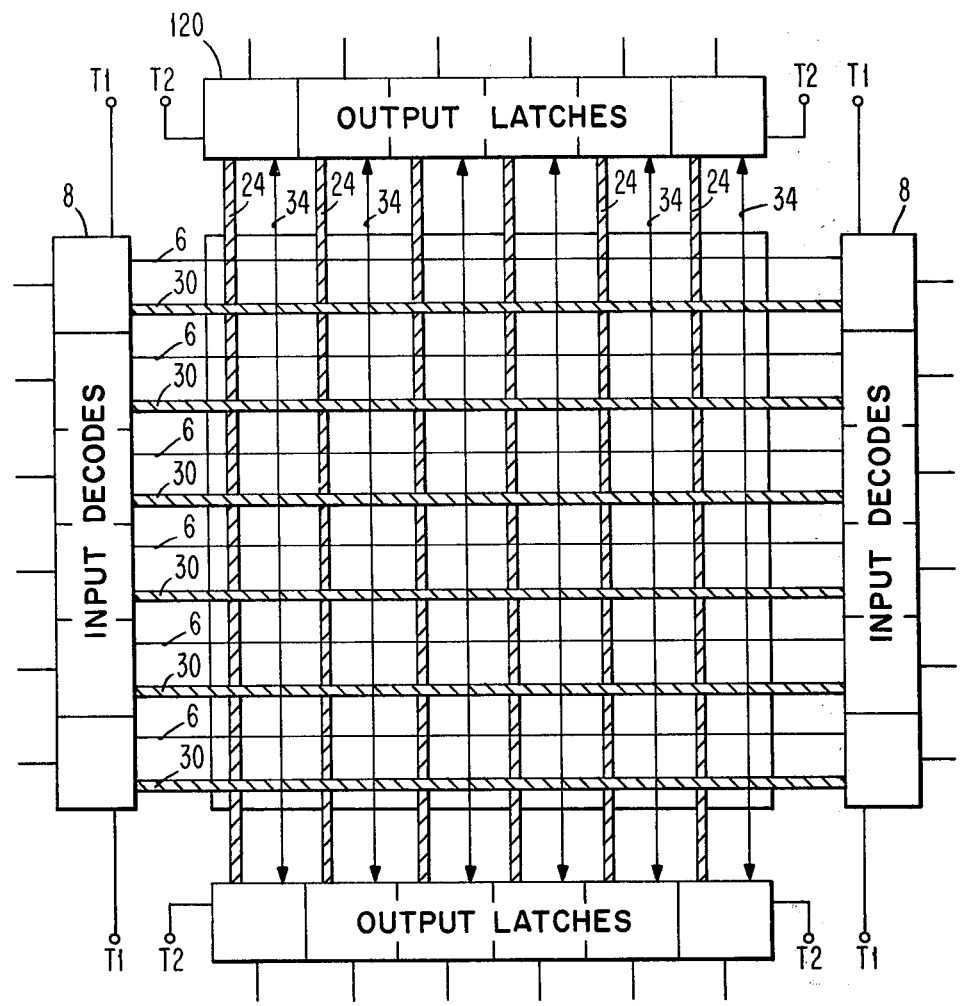
FIG. 12 is an overall view of the architectural arrangement for the test lines for the merged array PLA.
Figure 13:
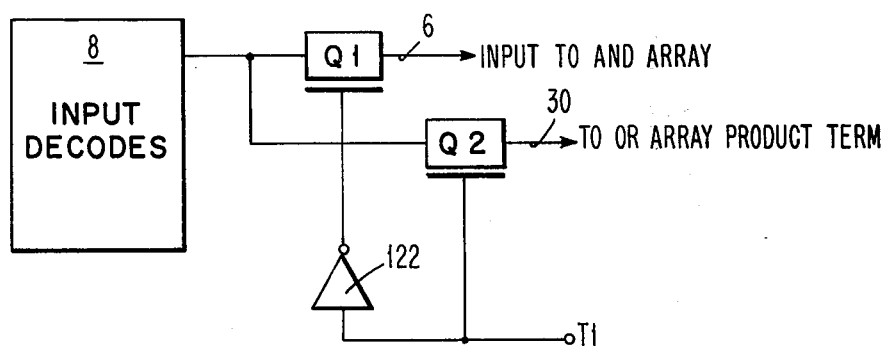
FIG. 13 is a schematic diagram of the testing circuitry to independently input test patterns to either the AND elements or the OR elements of the merged array PLA.
Figure 15:
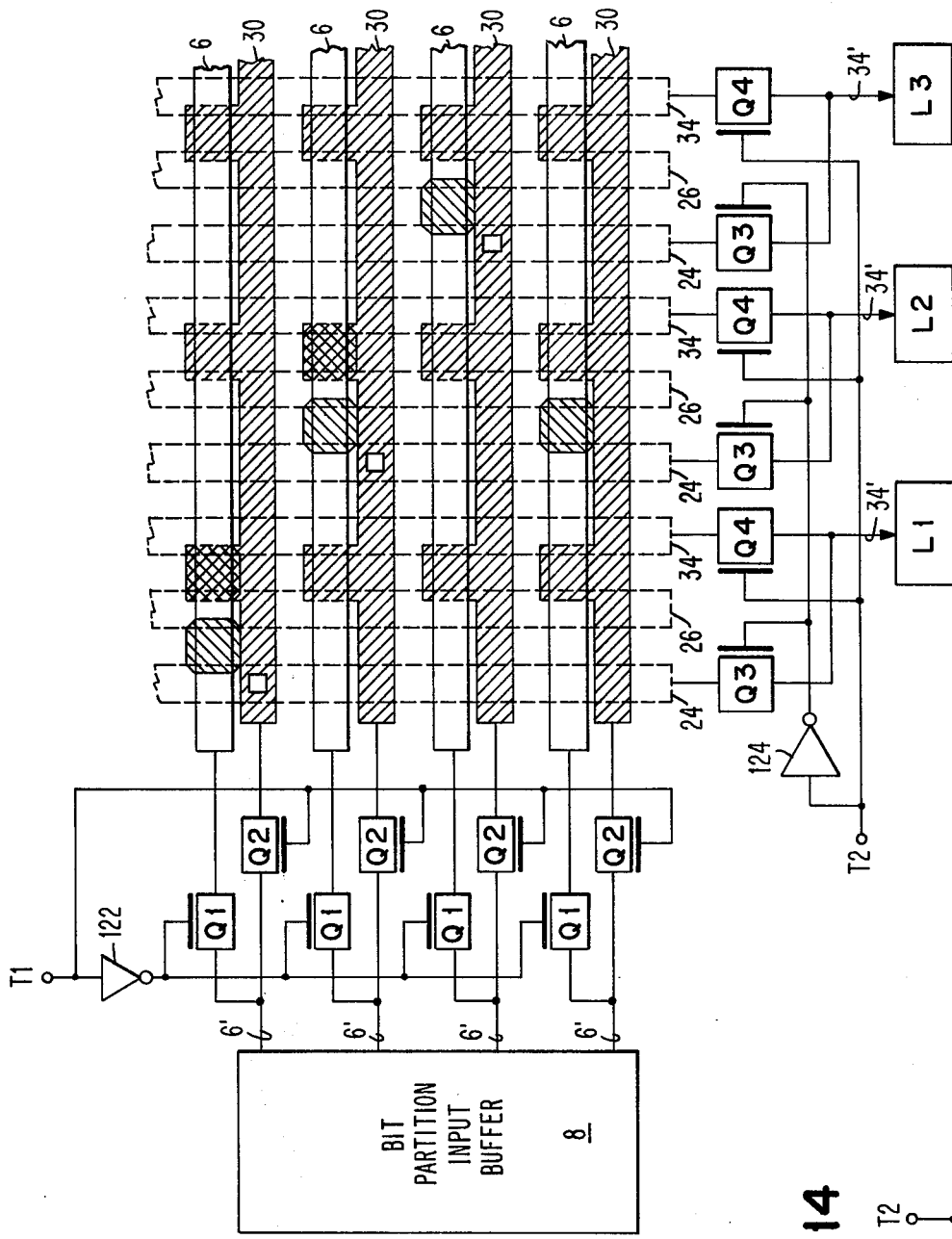
FIG. 15 illustrates the testing circuitry which permits the existing input buffer to input test patterns to either the AND elements or the OR elements and to output to the existing output latches the test response from the AND elements or the OR elements.
Figure 14:
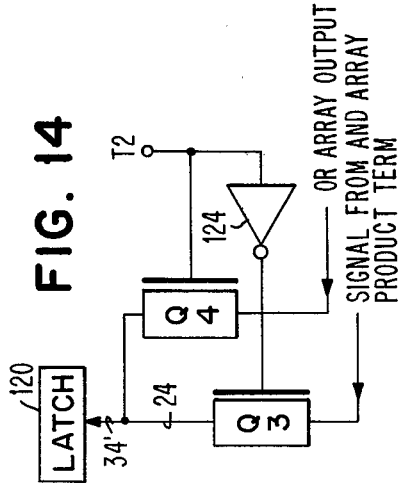
FIG. 14 is a schematic diagram of the testing circuitry to connect to the output latch, the test response of either the AND elements or the OR elements in the merged array PLA.

FIGS. 12, 13, 14 and 15 illustrate a testing improvement which acrues with the merged array PLA structure. FIG. 12 illustrates a configuration for the merged array PLA where input decoders 8 are formed on both sides of the array and output latches 120 are formed on the upper and lower sides of the array. Product term lines 24 may be extended to the output latches and polycrystalline silicon product term lines 30 may be extended to the bit partitioning input buffer and by means of a suitable switching circuit, the AND array elements can be independently tested from the OR array elements, thereby immensely simplifying the testing of the circuits.

Operation: The test sequence of the merged array PLA is begun with the test control $T_1$ down (0 state) and test control $T_2$ also down (0 state). In this condition, MOSFET device $Q_1$ is in a conducting (on) state, and MOSFET device $Q_2$ is in an off state. Normal bit partitioning signals propagate to the AND array input lines. When $T_2$ is at a 0 state, MOSFET device $Q_3$ is on and MOSFET device $Q_4$ is in an off state. Hence, the output of the AND array (product term) is propagated into the output latch. Hence, for the condition $T_1 = 0$, $T_2 = 0$, input bits on line 6' are propagated into the output latch. Thus, for the condition $T_1 = 0$, $T_2 = 0$, the AND array is tested uniquely with product term values defined as a function of personalization and stored in output latches. The test for the AND array is analogous to the read only memory test sequence with each AND array input activated individually (to a "1" state) with all other inputs at a "0" state. Devices that are personalized in the AND array on each activated input line will cause the associated product term output of the AND array to go to a "0" state. Unactivated AND array input sites will result in the product term remaining in a "1" state. The inversion is due to the NOR structure of the input line/product term combination.

SUMMARY OF THE AND ARRAY TEST

|  |  | Input Line | 1 2 3 4 5 6 7 8 | ... n |
|---|---|---|---|---|
| Control $T_1=0$ | Pattern 1 |  | 1 0 0 0 0 0 0 0 | ... 0 |
| Control $T_2=0$ | Pattern 2 |  | 0 1 0 0 0 0 0 0 | ... 0 |
|  | Pattern 3 |  | 0 0 1 0 0 0 0 0 | ... 0 |
|  | Pattern 4 |  | 0 0 0 1 0 0 0 0 | ... 0 |
|  | ... |  | ... |  |
|  | Pattern n |  | 0 0 0 0 0 0 0 0 | ... 1 |

For each input pattern, the AND array product term states are captured in the output latches and stored as test data. The product term states will reflect the personalization of the input devices on the input line being addressed. For example:

| Input Line | Personalization Example | (Product Term) AND Array Output States |  |
|---|---|---|---|
| 1 | 0 0 1 1 0 0 1 | 1 1 0 0 1 1 0 | (outputs |
| 2 | 1 0 0 0 0 0 0 | 0 1 1 1 1 1 1 | inverted |
| 3 | 0 0 1 0 0 1 1 | 1 1 0 1 1 0 0 | due to |
| 4 | 1 0 1 0 1 1 1 | 0 1 0 1 0 0 0 | NOR logic) |
| ... |  | ... |  |
| n | 0 0 0 0 0 1 1 | 1 1 1 1 1 0 0 |  |

Hence: to perform a function test of the merged array PLA AND array, given an AND array with n inputs, requires only n patterns.

The operation of the OR array test sequence is as follows:

Control $T_1$ set at 1 state — this disables the AND array input lines from bit partitioning circuit and provides the bit partitioning signal to the OR array product term input Control $T_2$ set at 1 state — this disables the AND array product term line from the latch and activates the OR array output line connected to the latch.

In a similar manner as the AND array test, the OR array can be uniquely tested with inputs provided by the bit partitioning circuit to the OR array product terms. OR array output values, corresponding to OR array personalization and product terms activated ("1" states) are passed to the output latches through OR output lines.

Hence: for an OR array with "m" product terms, we require m test patterns to implement a complete functional test of the OR array.

For a real PLA (without folding) n=m.

For a virtual/folded PLA, m may not equal n.

We see that for the symmetrical merged array PLA, test pattern generation and implementation is very straightforward.

For normal operation,
$T_1 = 0$ allowing AND inputs to receive signals from bit partitioning circuits.
$T_2 = 1$ allowing OR array outputs to be transmitted into OR array output latches.

|  | $T_1$ | $T_2$ |
|---|---|---|
| AND Array Test | 0 | 0 |
| OR Array Test | 1 | 1 |
| Normal Operation | 0 | 1 |

While the invention has been particularly shown and described with reference to the embodiment thereof, various changes in form and detail may be made therein without departing from the spirit and scope of the invention.

We claim:

1. A testing circuit for a merged array programmable logic array having an AND array element with an input conductor and product term output conductor which serves as the input to an OR array element having an output conductor, comprising:

a first input gating field effect transistor connected between said input conductor and an input signal source having its gate connected through an inverter to a first test bit signal source;

a second input gating field effect transistor connected between said product term conductor and said input signal source having its gate connected to said first test bit signal source;

a first output gating field effect transistor connected between said product term conductor and an output latch and having its gate connected through an inverter to a second test bit signal source;

a second output gating field effect transistor connected between said output conductor and said output latch and having its gate connected to said second test bit signal source;

whereby said AND array field effect transistor device and said OR array field effect transistor device can be independently tested by a simple algorithm of test patterns equivalent in number to the sum of the number of AND array inputs and the number of OR array product terms.

2. In a semiconductor structure for a programmed logic array having an AND array and an OR array of field effect transistor devices, a testing circuit comprising:

a semiconductor substrate of a first conductivity type;

a spaced parallel array of diffusion lines of a second conductivity type in said substrate;

a first insulating layer overlying said substrate having a first plurality of openings selectively defining field effect transistor gates for said OR array, second plurality of openings selectively defining field effect transistor drains for said AND array, and a third plurality of openings selectively defining field effect transistor gates in said AND array;

a first, spaced parallel array of conductor lines overlying said first insulator layer and oriented perpendicularly to said diffusion lines, having a conductor passing through one of said first openings to form the gate of a first field effect transistor device in said OR array and passing through one of said third openings proximate to said one of said first openings, to form a drain contact for a second contiguous field effect transistor device in said AND array;

a second insulating layer overlying said first array of conductor lines having a plurality of openings over said second openings in said first insulating layer;

a second spaced, parallel array of conductor lines overlying said second insulator layer and oriented parallel with said first spaced parallel array of conductor lines, having a conductor passing through one of said openings in said second insulating layer to form the gate of said second field effect transistor device, forming an input to said AND array;

a first input gating field effect transistor connected between one of said second conductor lines and an input signal source having its gate connected through an inverter to a first test bit signal source;

a second input gating field effect transistor connected between said one of said first conductor lines and said input signal source having its gate connected to said first test bit signal source;

a first output gating field effect transistor connected between one of said diffusion lines forming the drain of said second field effect transistor AND array device and an output latch and having its gate connected through an inverter to a second test bit signal source;

a second output gating field effect transistor connected between one of said diffusion lines forming the drain of said first field effect transistor OR array device and said output latch and having its gate connected to said second test bit signal source;

whereby said AND array field effect transistor device and said OR array field effect transistor device can be independently tested by a simple algorithm of test patterns equivalent in number to the sum of the number of AND array inputs and the number of OR array product terms.

3. In a semiconductor structure for a programmed logic array having an AND array and an OR array of field effect transistor devices, a testing circuit comprising:

a semiconductor substrate of a first conductivity type;

a spaced, parallel array of diffusion segments of a second conductivity type oriented in a first direction;

a first insulating layer lying on said substrate having a first window between first and second ones of said diffusion segments with a relatively thin insulating layer in the bottom thereof forming the gate region for a first field effect transistor device in said AND array, said first insulating layer having a second window between said second one and a third one of said diffusion segments with a relatively thin insulating layer in the bottom thereof forming the gate region for a second field effect transistor device in said OR array;

said first insulating layer having third, fourth and fifth windows over said first, second and third diffusion segments, respectively, as via holes for contacts to a product term conductor, a reference voltage conductor and output conductor, respectively;

a first layer of polycrystalline silicon lying on top of said thin insulating layer in said first window and said thin insulating layer in said second window, serving as the gate electrodes for said first and second field effect transistor devices, respectively;

a second insulating layer lying on top of said first layer of polycrystalline silicon having first and second windows over said first and second field effect transistor devices, respectively and third, fourth and fifth windows over said third, fourth and fifth windows in said first insulating layer;

a second layer of polycrystalline silicon lying on top of said second insulating layer, with a portion passing through said second window in said second insulating layer and contacting said first polycrystalline silicon layer over said second field effect transistor device, forming the said product term conductor line lying in a second direction perpendicular to said first direction with first and second windows over said fourth and fifth windows of said second insulating layer and a via contact to said first diffusion segment, through said third window of said second insulating layer;

a third insulating layer lying on top of said second layer of polycrystalline silicon having a first window over said first window of said second insulating layer and second, third and fourth windows over said third and fourth and fifth windows of said second insulating layer, respectively;

a first layer of metal lying on top of said third insulating layer, forming a plurality of conductor lines oriented in said first direction with a first metal line as a product term conductor lying over said first diffusion segment and connected by means of a via contact through said second window of said third insulating layer to said second layer polycrystalline silicon product term conductor line, with a second metal line as a ground conductor lying over said second diffusion segment and connected by means of a via contact through said third window of said third insulating layer to said second diffusion segment, and with a third metal line as an output conductor lying over said third diffusion segment and connected by means of a via contact through said fourth window of said third insulating layer to said third diffusion segment;

a fourth insulating layer lying on top of said first metal layer, having a window over said first window of said third insulating layer;

a second metal layer lying on top of said fourth insulating layer, forming an input line in said second direction with a portion passing through said window in said fourth insulating layer forming the gate input conductor for said first field effect transistor in said AND array;

a first input gating field effect transistor connected between said input line and an input signal source having its gate connected through an inverter to a first test bit signal source;

a second input gating field effect transistor connected between said product term metal conductor line and said input signal source having its gate connected to said first test bit signal source;

a first output gating field effect transistor connected between said product term metal conductor line and an output latch and having its gate connected through an inverter to a second test bit signal source;

a second output gating field effect transistor connected between said output metal conductor and said output latch and having its gate connected to said second test bit signal source;

whereby said AND array field effect transistor device and said OR array field effect transistor device can be independently tested by a simple algorithm of test patterns equivalent in number to the sum of the number of AND array inputs and the number of OR array product terms.

* * * * *

UNITED STATES PATENT AND TRADEMARK OFFICE
CERTIFICATE OF CORRECTION

PATENT NO. : 4,140,967

DATED : February 20, 1979

INVENTOR(S) : P. S. Balasubramanian, Claude L. Bertin, and S. B. Greenspan

It is certified that error appears in the above-identified patent and that said Letters Patent are hereby corrected as shown below:

Please change "Claude R. Bertin" to --Claude L. Bertin--.

Signed and Sealed this

Eighteenth Day of September 1979

[SEAL]

Attest:

LUTRELLE F. PARKER

*Attesting Officer*   *Acting Commissioner of Patents and Trademarks*